United States Patent [19]
Yeh

[11] Patent Number: 6,133,149
[45] Date of Patent: Oct. 17, 2000

[54] METHOD OF IMPROVING THERMAL STABILITY OF TUNGSTEN SILICIDE

[75] Inventor: Ta-Hsun Yeh, Hsinchu, Taiwan

[73] Assignees: ProMOS Technologies Inc.; Mosel Vitelic Inc., both of Hsinchu, Taiwan; Siemens AG, Munich, Germany

[21] Appl. No.: 09/132,692

[22] Filed: Aug. 11, 1998

[30] Foreign Application Priority Data

Jun. 19, 1998 [TW] Taiwan ................................ 87109850

[51] Int. Cl.$^7$ ................................................ H01L 21/44
[52] U.S. Cl. ........................... 438/682; 438/653; 438/655
[58] Field of Search ..................................... 438/682, 950, 438/948, 637, 649, 653, 655, 945, 680

[56] References Cited

U.S. PATENT DOCUMENTS 4,931,410  6/1990  Tokunaga et al. .
5,923,999  7/1999  Balasubramanyam et al. ......... 438/592

FOREIGN PATENT DOCUMENTS 08321503  12/1996  Japan .

*Primary Examiner*—Caridad Everhart
*Attorney, Agent, or Firm*—Thomas, Kayden, Horstemeyer & Risley

[57] ABSTRACT

A method of forming a thermally stable tungsten silicide layer. The method includes sequentially forming a polysilicon layer and a tungsten silicide layer over a semiconductor substrate. Then, the semiconductor substrate is exposed to nitrogen ($N_2$) plasma at room temperature so that a nitridation reaction can be initiated, thereby forming a thin tungsten nitride layer over the tungsten silicide layer. Thereafter, a silicon nitride layer is formed over the tungsten nitride layer. Since the thermal stability of a tungsten nitride layer is higher, the probability of re-crystallization in the tungsten silicide layer when the silicon nitride layer is subsequently deposited is reduced. Moreover, tungsten nitride is able to fill the voids and crevices at the grain boundaries of the tungsten silicide layer after the tungsten silicide layer is re-crystallized. Finally, photolithographic and etching operations are carried out to form a gate structure over the semiconductor substrate.

10 Claims, 3 Drawing Sheets

METHOD OF IMPROVING THERMAL STABILITY OF TUNGSTEN SILICIDE

CROSS-REFERENCE TO RELATED APPLICATION

This application claims the priority benefit of Taiwan application serial no. 87109850, filed Jun. 19, 1998, the full disclosure of which is incorporated herein by reference.

BACKGROUND OF THE INVENTION

1. Field of Invention

The present invention relates to a method of manufacturing integrated circuits. More particularly, the present invention relates to a method of manufacturing thermally stable tungsten silicide in the gate structure of a metal-oxide-semiconductor (MOS) device.

2. Description of Related Art

Because refractory metal silicide has the special properties of a high melting point, thermal stability and low resistivity, it is now extensively used in the fabrication of VLSI devices in semiconductor industry. Refractory metal silicide is usually formed between a silicon layer and an aluminum layer to improve their ohmic contact. The refractory metal silicide is also formed as part of the metallic layer in a MOS gate. The most commonly used refractory metal silicide includes tungsten silicide ($WSi_x$).

When a doped polysilicon layer is deposited over a tungsten silicide layer, a polysilicon/tungsten silicide layer or a polycide layer for shorts is formed. Polycide layers are now routinely used in commercial VLSI production processes involving the formation of gate conductive layers. Tungsten silicide is normally deposited over other materials using a low-pressure chemical vapor deposition (LPCVD) or a sputtering method. After the polysilicon layer and the tungsten silicide layer are properly deposited, photolithographic and etching techniques are used to pattern the polycide layer forming the gate structure of a MOS. Since the line width of a conductive layer must be controlled precisely, the polycide layer must also be etched using an anisotropic dry etching operation.

In general, in addition to the polysilicon layer and the tungsten silicide layer, a silicon nitride layer ($Si_3N_4$) is also deposited over the tungsten silicide layer. This silicon nitride layer is used as a cap protecting the gate terminal. Normally, the silicon nitride layer is formed using a low-pressure chemical vapor deposition (LPCVD) process. However, the process of depositing silicon nitride over the tungsten silicide layer generally requires a very high temperature. Consequently, the tungsten silicide layer will also re-crystallize forming voids and then, silicon nitride crevices at the grain boundaries.

FIGS. 1A through 1D are cross-sectional views showing the progression of manufacturing steps in producing a gate structure according to a conventional method. First, as shown in FIG. 1A, a semiconductor substrate 100 is provided. Then, a polysilicon layer 102 and a tungsten silicide layer 104 are sequentially formed over the substrate 100. For example, the polysilicon layer 102 can be formed by using a low-pressure chemical vapor deposition process, and the tungsten silicide layer 104 can be formed by using a physical vapor deposition (PVD) process.

Next, as shown in FIG. 1B, a silicon nitride layer 106 is formed over the tungsten slicide layer 104 using, for example, a low pressure chemical vapor deposition (LPCVD) process. While silicon nitride is being deposited over the tungsten silicide layer 104, the tungsten silicide layer 104 re-crystallizes, forming a grainy tungsten silicide layer 104' having a number of voids and crevices at the grain boundaries 108. Consequently, the silicon nitride above the tungsten silicide layer will gradually move down to fill these voids and crevices at the grain boundaries 108 as shown in FIG. 1B.

Thereafter, as shown in FIG. 1C, photolithographic and etching operations are carried out to remove a portion of the silicon nitride layer 106, the tungsten silicide layer 104' and the polysilicon layer 102 to form a gate structure 110.

Ideally, portions of the silicon nitride layer 106, the tungsten silicide layer 104' and the polysilicon layer 102 lying outside the gate region should be completely removed when those layers are etched as shown in FIG. 1C. However, due to the presence of silicon nitride material in the voids and crevices at the grain boundaries 108 of the tungsten silicide layer 104', the etching operation is unable to remove all the silicon nitride material deep down inside the boundaries when the silicon nitride layer 106 is patterned.

Consequently, a residual silicon nitride layer 106' will remain as shown in FIG. 1D. This silicon nitride layer 106' act like a hard mask preventing the subsequent etching of the tungsten silicide layer 104' and the polysilicon layer 102. Therefore, bit lines may be short-circuited and erroneous signals may be generated while the device is in operation.

In light of the foregoing, there is a need to improve the thermal stability of a tungsten silicide layer.

SUMMARY OF THE INVENTION

Accordingly, the present invention provides a method of forming a thermally stable tungsten silicide layer through the formation of a thin tungsten nitride layer ($WN_x$) on the tungsten silicide surface by a nitridation process. This thin tungsten nitride layer not only is capable of reducing re-crystallization in the tungsten silicide layer, but also prevent silicon nitride to fill the voids and crevices at the grain boundaries of the tungsten silicide layer during subsequential deposition of silicon. Therefore, when the silicon nitride layer is etched to form the gate structure, the tungsten silicide layer and polysilicon layer below the silicon nitride layer can be etched with ease.

To achieve these and other advantages and in accordance with the purpose of the invention, as embodied and broadly described herein, the invention provides a method of forming a thermally stable tungsten silicide layer. The method includes sequentially forming a polysilicon layer and a tungsten silicide layer over a semiconductor substrate. Then, the semiconductor substrate is exposed to nitrogen ($N_2$) plasma at room temperature so that a nitridation reaction can be initiated, thereby forming a thin tungsten nitride layer over the tungsten silicide layer. Thereafter, a silicon nitride layer is formed over the tungsten nitride layer. Finally, photolithographic and etching operations are carried out to form a gate structure over the semiconductor substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
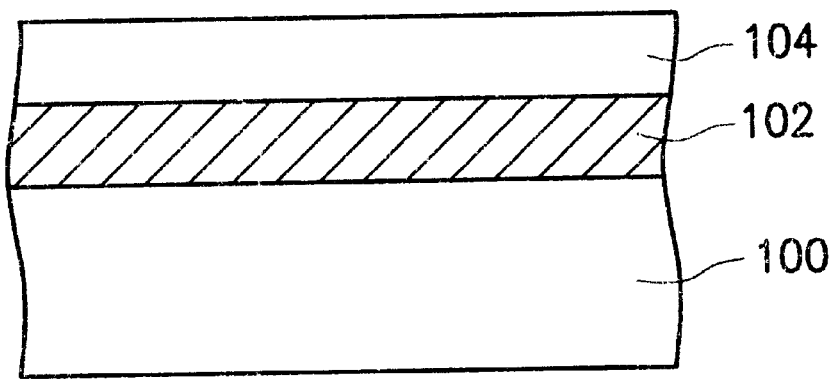
FIGS. 1A through 1D are cross-sectional views showing the progression of manufacturing steps in producing a gate structure according to a conventional method.
Figure 1B:
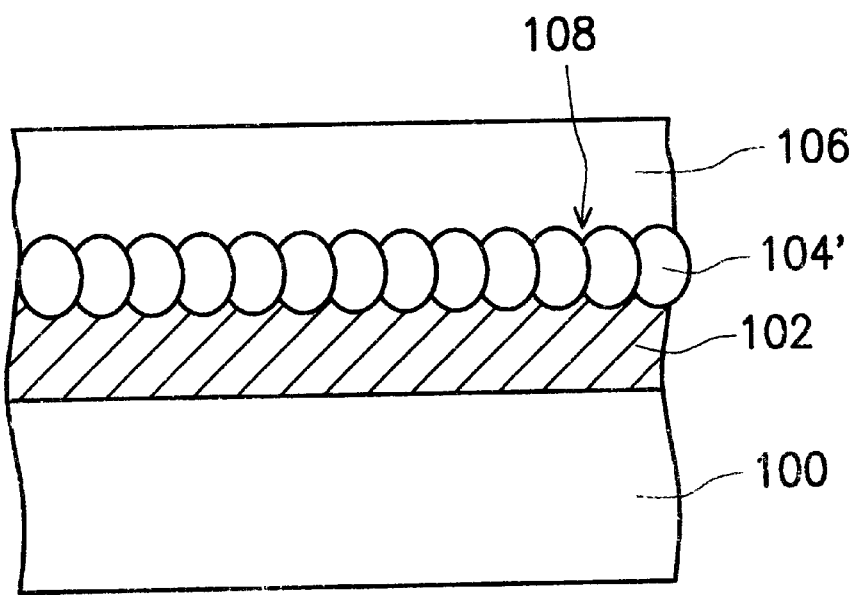
Figure 1C:
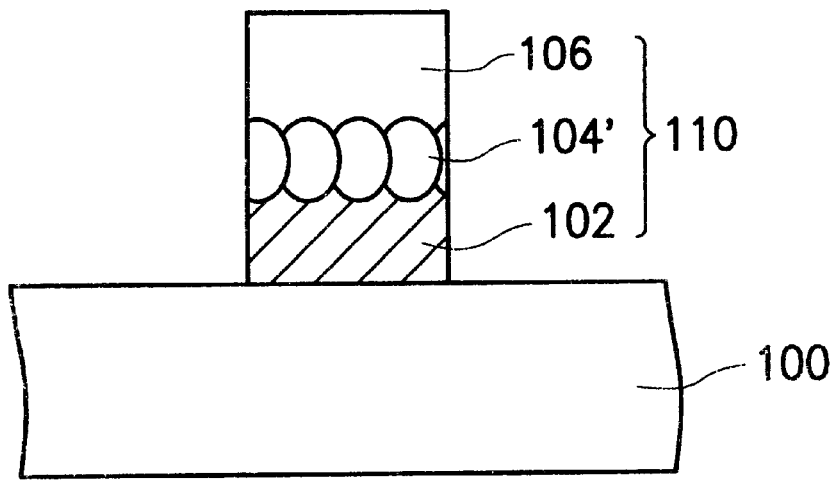
Figure 1D:
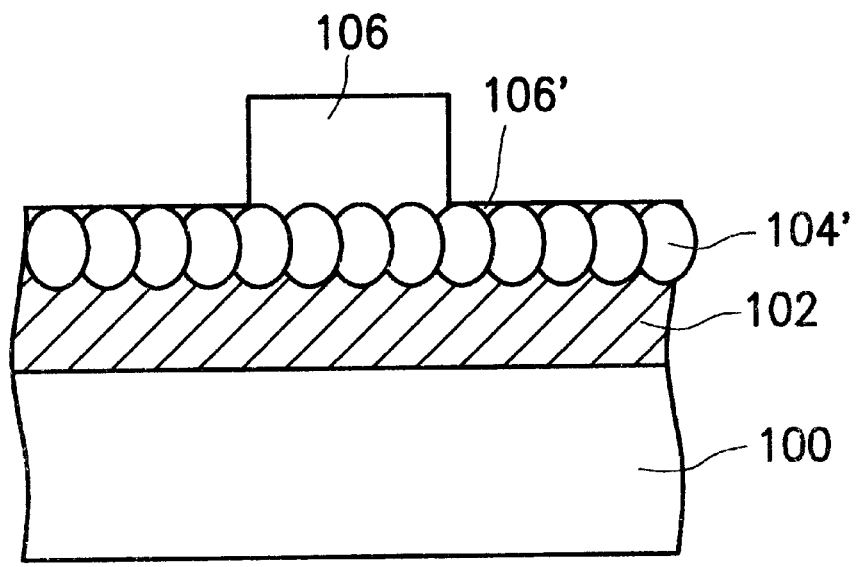

Reference will now be made in detail to the present preferred embodiments of the invention, examples of which are illustrated in the accompanying drawings. Wherever possible, the same reference numbers are used in the drawings and the description to refer to the same or like parts.

Figure 2A:
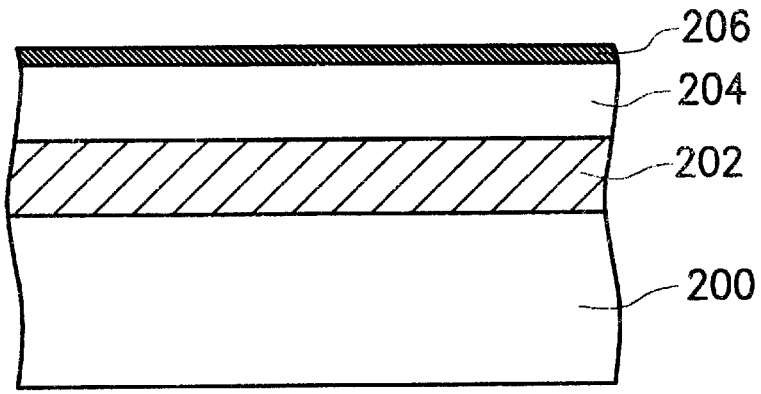
FIGS. 2A through 2C are cross-sectional views showing the progression of manufacturing steps in producing a gate structure according to one preferred embodiment of this invention.
Figure 2B:
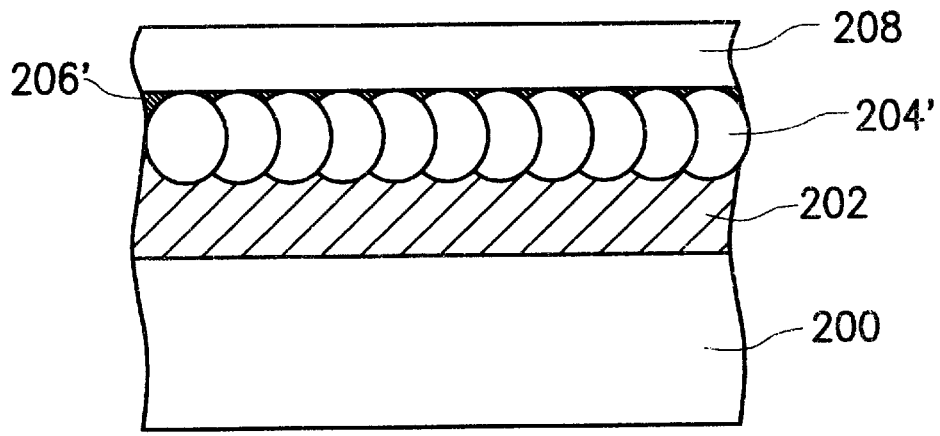
Figure 2C:
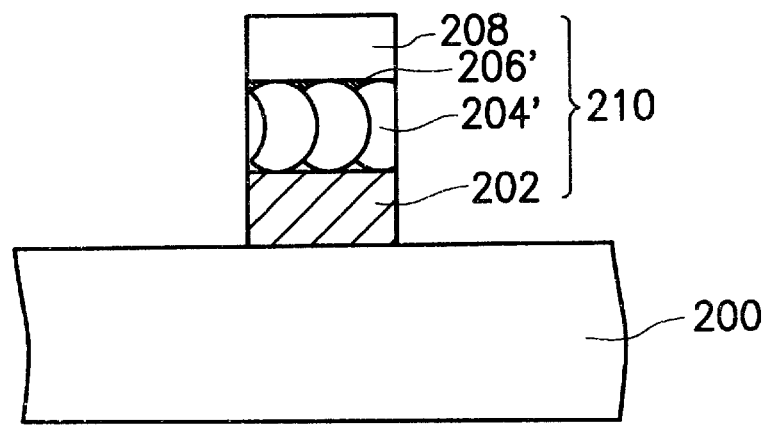

FIGS. 2A through 2C are cross-sectional views showing the progression of manufacturing steps in producing a gate structure according to one preferred embodiment of this invention.

First, as shown in FIG. 2A, a semiconductor substrate 200 is provided. Then, a polysilicon layer 202 and a tungsten silicide layer 204 are sequentially formed over the substrate 200. For example, the polysilicon layer 202 can be formed by using a low-pressure chemical vapor deposition process, and the tungsten silicide layer 204 can be formed by using a physical vapor deposition (PVD) process.

Next, the layered substrate is exposed to nitrogen plasma at room temperature to carry out a nitridation reaction. Consequently, a thin tungsten nitride layer 206 ($WN_x$) is formed over the tungsten silicide layer 204. The nitridation reaction is carried out for about 5 minutes and the tungsten nitride layer 206 so formed has a thickness of about 5 nm. Moreover, the tungsten nitride layer 206 is a tungsten-rich material as Auger Electron Spectroscopy (AES) analysis. In other words, the tungsten nitride layer 206 has a high percentage of tungsten so that its properties are close to the tungsten silicide layer 204.

Next, as shown in FIG. 2B, a silicon nitride layer 208 is formed over the tungsten nitride layer 206. The silicon nitride layer 208 can be formed using a low pressure chemical vapor deposition (LPCVD) process. When silicon nitride material is being deposited, the tungsten silicide layer below will re-crystallize to form a large number of crystal grains. Hence, a large number of voids and crevice are formed at the grain boundaries of the re-crystallized tungsten silicide layer 204'. Consequently, tungsten nitride material from the tungsten nitride layer 206' above will move into and fill these voids and crevices, thereby forming the structure as shown in FIG. 2B.

Thereafter, as shown in FIG. 2C, photolithographic and etching operations are carried out to remove a portion of the silicon nitride layer 208, the tungsten nitride layer 206', the tungsten silicide layer 204' and the polysilicon layer 202. Finally, a complete gate structure 210 is formed.

Tungsten nitride layer 206' has properties very similar to the tungsten silicide layer 204'. Furthermore, voids and crevices at the grain boundaries of the re-crystallized tungsten silicide layer 204' have been filled by activated nitrogen atoms in the plasma. Therefore, subsequently deposited silicon nitride layer 208 is prevented from moving in to fill the voids in the tungsten silicide layer. Hence, no residual silicon nitride layer is formed over the tungsten silicide layer. The presence of a residual nitride layer can act as an unwanted hard mask when the tungsten silicide layer and the polysilicon layer are etched to form the gate structure.

In addition, since the tungsten suicide layer is covered on top by a tungsten nitride layer, thermal stability of the tungsten silicide layer is increased. In fact, re-crystallization temperature of the tungsten silicide layer is raised by up to 50° C. compared to a tungsten silicide layer without a tungsten nitride cover. Moreover, the tungsten nitride layer can be formed in the same reaction station as other required deposition processes.

The only change necessary for forming a tungsten nitride layer after the tungsten silicide layer is formed is to pass nitrogen plasma into the reaction station. Without the need for switching stations, the low-pressure environment inside a reaction station can be maintained throughout the deposition process and hence this method is capable of saving some production cost.

In summary, one major aspect of this invention is the nitridation reaction using gaseous nitrogen plasma at room temperature to form a tungsten nitride layer over the tungsten silicide layer. The tungsten nitride layer acts as a barrier for silicon nitride material to move into the voids and crevices of the tungsten silicide layer created in re-crystallization. Consequently, no residual silicon nitride layer is formed over the tungsten silicide layer to affect the etching operation that may lead to device damages.

Another aspect of this invention is that the nitridation reaction is carried out at room temperature, and hence the overall thermal budget is not increased. Furthermore, the tungsten nitride layer that forms over the tungsten silicide layer is capable of providing a protective function so that the tungsten silicide layer is thermally more stable. In fact, the re-crystallization temperature of the tungsten silicide layer is increased by almost 50° C. over a tungsten silicide layer not having a tungsten nitride on top.

One further aspect of this invention is that the nitridation reaction and deposition process can be carried out in the same station. Hence, there is no need for additional equipment. In addition, processing steps are simple and so do not incur extra production cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a thermally stable tungsten silicide layer, the method comprising the steps of:

providing a semiconductor substrate that has a polysilicon layer and a tungsten silicide layer formed thereon;

forming a tungsten nitride layer over the tungsten silicide layer;

forming a silicon nitride layer over the tungsten nitride layer, wherein the tungsten nitride layer prevents the silicon nitride layer from entering into the tungsten silicide layer as re-crystallization occurs on the tungsten silicide layer due to a working temperature when forming the silicon nitride layer; and removing a portion of the silicon nitride layer, the tungsten nitride layer, the tungsten silicide layer and the polysilicon layer to form a gate structure.

2. The method of claim 1, wherein the step of forming the tungsten nitride layer includes performing a nitridation reaction using nitrogen plasma.

3. The method of claim 2, wherein the nitridation reaction for forming the tungsten nitride layer is carried out at room temperature.

4. The method of claim 2, wherein the nitridation reaction for forming the tungsten nitride layer is carried out for a period of 5 minutes.

5. The method of claim 1, wherein the tungsten nitride layer has a thickness of about 5 nm.

6. The method of claim 1, wherein the step of forming the tungsten nitride layer includes a plasma-enhanced chemical vapor deposition process.

7. A method of forming a thermally stable tungsten silicide layer, the method comprising the steps of:

provide a semiconductor substrate;

forming a polysilicon layer over the semiconductor substrate;

forming a tungsten silicide layer over the polysilicon layer;

performing a nitridation reaction using nitrogen plasma to form a tungsten nitride layer over the tungsten silicide layer;

forming a silicon nitride layer over the tungsten nitride layer, wherein the tungsten nitride layer prevents the silicon nitride layer from entering into the tungsten silicide layer as re-crystallization occurs on the tungsten silicide layer due to a working temperature when forming the silicon nitride layer; and performing photolithographic and etching operations to remove a portion of the silicon nitride layer, the tungsten nitride layer, the tungsten silicide layer and the polysilicon layer to form a gate structure.

8. The method of claim 7, wherein the nitridation reaction for forming the tungsten nitride layer is carried out at room temperature.

9. The method of claim 7, wherein the nitridation reaction for forming the tungsten nitride layer is carried out for a period of 5 minutes.

10. The method of claim 7, wherein the tungsten nitride layer has a thickness of about 5 nm.

\* \* \* \* \*